US009208896B2

(12) United States Patent
Harada

(10) Patent No.: US 9,208,896 B2
(45) Date of Patent: *Dec. 8, 2015

(54) NONVOLATILE SEMICONDUCTOR MEMORY DEVICE

(71) Applicant: KABUSHIKI KAISHA TOSHIBA, Minato-ku (JP)

(72) Inventor: Yoshikazu Harada, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/548,100

(22) Filed: Nov. 19, 2014

(65) Prior Publication Data

US 2015/0078083 A1 Mar. 19, 2015

Related U.S. Application Data

(63) Continuation of application No. 13/483,427, filed on May 30, 2012, now Pat. No. 8,913,446.

(30) Foreign Application Priority Data

Sep. 30, 2011 (JP) ................................. 2011-217826

(51) Int. Cl.
G11C 7/00 (2006.01)
G11C 16/34 (2006.01)
G11C 11/56 (2006.01)
G11C 16/04 (2006.01)
G11C 16/14 (2006.01)

(52) U.S. Cl.
CPC ........ *G11C 16/3459* (2013.01); *G11C 11/5628* (2013.01); *G11C 16/0483* (2013.01); *G11C 16/14* (2013.01); *G11C 2211/5621* (2013.01)

(58) Field of Classification Search
USPC .............. 365/189.16, 185.18, 185.17, 185.22
See application file for complete search history.

(56) References Cited

U.S. PATENT DOCUMENTS

| 5,986,928 | A | 11/1999 | Engh et al. | |
|---|---|---|---|---|
| 6,292,392 | B1 | 9/2001 | Fukui | |
| 6,580,644 | B1 | 6/2003 | Chung | |
| 6,937,524 | B2 | 8/2005 | Shiga et al. | |
| 7,027,329 | B2 | 4/2006 | Sakuma et al. | |
| 7,376,015 | B2* | 5/2008 | Tanaka et al. | 365/185.22 |
| 7,606,086 | B2* | 10/2009 | Inoue | 365/189.15 |

(Continued)

FOREIGN PATENT DOCUMENTS

| JP | 2005-25898 | 1/2005 |
|---|---|---|
| JP | 2009-129479 | 6/2009 |
| JP | 2010-135023 | 6/2010 |

(Continued)

OTHER PUBLICATIONS

Office Action issued Apr. 2, 2013 in Japanese Patent Application No. 2011-217826 with English language translation.

*Primary Examiner* — Pho M Luu
(74) *Attorney, Agent, or Firm* — Oblon, McClelland, Maier & Neustadt, L.L.P.

(57) ABSTRACT

A nonvolatile semiconductor memory device includes a write control unit that performs a first write operation with respect to a first threshold distribution, a first verify operation on the first threshold distribution, and a second write operation on the basis of a result of the first verify operation, and then starts a third write operation with respect to a second threshold distribution.

18 Claims, 12 Drawing Sheets

(56) References Cited

U.S. PATENT DOCUMENTS

| | | | |
|---|---|---|---|
| 8,743,604 B2* | 6/2014 | Chae | 365/185.03 |
| 8,804,431 B2* | 8/2014 | Miwa et al. | 365/185.18 |
| 8,913,446 B2* | 12/2014 | Harada | 365/189.16 |
| 2009/0129157 A1 | 5/2009 | Honda et al. | |
| 2010/0142271 A1 | 6/2010 | Honma et al. | |

FOREIGN PATENT DOCUMENTS

| | | |
|---|---|---|
| JP | 2011-118984 | 6/2011 |
| WO | WO 2009/158350 A1 | 12/2009 |

\* cited by examiner

BLn-WRITE PROHIBIT VOLTAGE (ex.2.5V)

BLn+1-WRITE PROHIBIT VOLTAGE (ex.2.5V)

BLn+2-WRITE PROHIBIT VOLTAGE (ex.2.5V)

BLn+3-WRITE VOLTAGE (ex.0V)

BLn+4-WRITE VOLTAGE (ex.0V)

WLk-WRITE VOLTAGE (VP+ΔVP1)

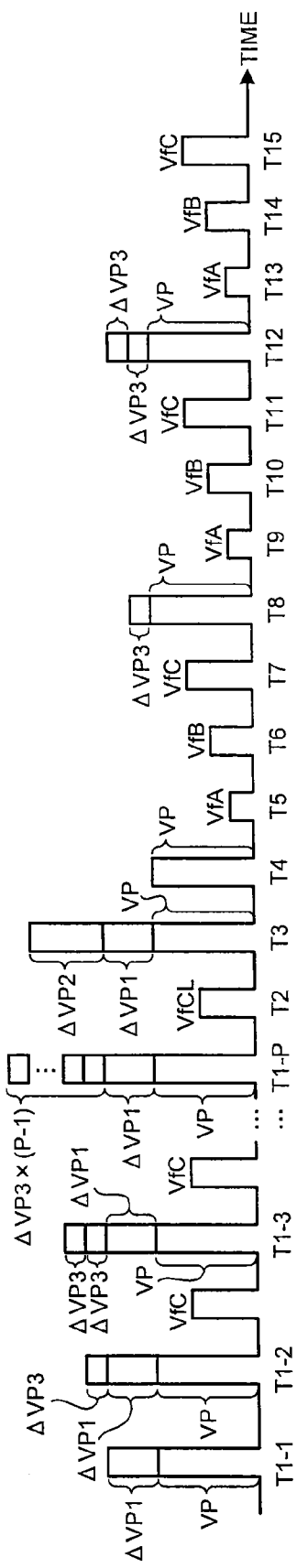

FIG.5E

BLn-WRITE PROHIBIT VOLTAGE (ex.2.5V)

BLn+1-WRITE PROHIBIT VOLTAGE (ex.2.5V)

BLn+2-WRITE PROHIBIT VOLTAGE (ex.2.5V)

BLn+3-WRITE PROHIBIT VOLTAGE (ex.2.5V)

BLn+4-WRITE VOLTAGE (ex.0V)
WLk-WRITE VOLTAGE (VP+$\Delta$VP1+$\Delta$VP2)

FIG.5F

BLn-WRITE PROHIBIT VOLTAGE (ex.2.5V)

BLn+1-WRITE VOLTAGE (ex.0V)

BLn+2-WRITE VOLTAGE (ex.0V)

BLn+3-WRITE VOLTAGE (ex.0V)

BLn+4-WRITE VOLTAGE (ex.0V)
WLk-WRITE VOLTAGE (VP)

FIG.5G

BLn-WRITE PROHIBIT VOLTAGE (ex.2.5V)

BLn+1-WRITE PROHIBIT VOLTAGE (ex.2.5V)

BLn+2-WRITE VOLTAGE (ex.0V)

BLn+3-WRITE VOLTAGE (ex.0V)

BLn+4-WRITE VOLTAGE (ex.0V)
WLk-WRITE VOLTAGE (VP+$\Delta$VP3)

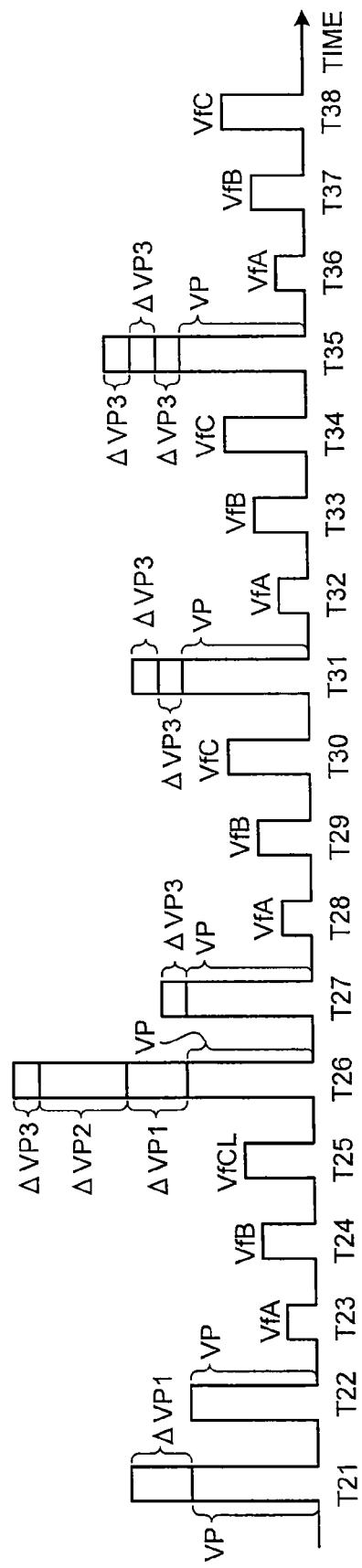

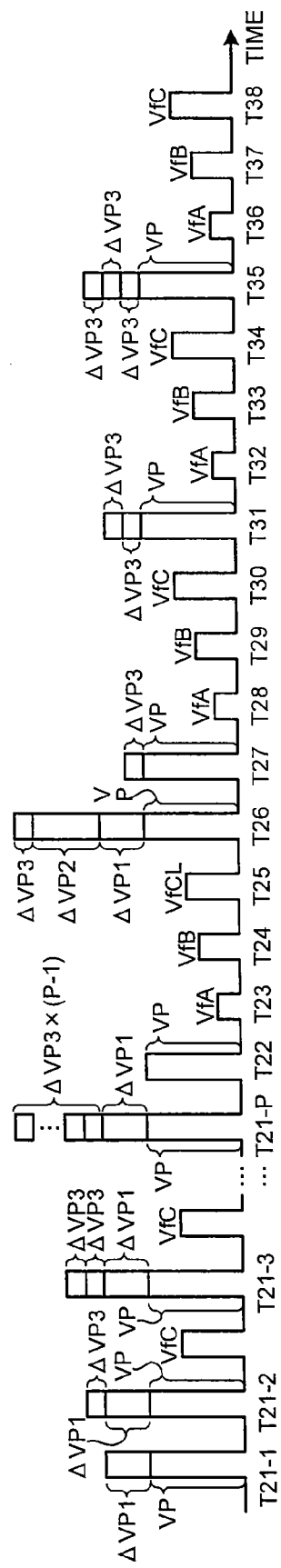

FIG.7C

BLn-WRITE PROHIBIT VOLTAGE (ex.2.5V)

BLn+1-WRITE VOLTAGE (ex.0V)

BLn+2-WRITE VOLTAGE (ex.0V)

BLn+3-WRITE PROHIBIT VOLTAGE (ex.2.5V)

BLn+4-WRITE PROHIBIT VOLTAGE (ex.2.5V)

WLk-WRITE VOLTAGE (VP)

FIG.7D

BLn-WRITE PROHIBIT VOLTAGE (ex.2.5V)

BLn+1-WRITE VOLTAGE (ex.0V)

BLn+2-WRITE VOLTAGE (ex.0V)

BLn+3-WRITE VOLTAGE (ex.0V)

BLn+4-WRITE VOLTAGE (ex.0V)

WLk-WRITE VOLTAGE (VP)

NONVOLATILE SEMICONDUCTOR MEMORY DEVICE

CROSS-REFERENCE TO RELATED APPLICATIONS

This application is a continuation of U.S. application Ser. No. 13/483,427, now U.S. Pat. No. 8,913,446, filed May 30, 3012, and based upon and claims the benefit of priority from Japanese Patent Application No. 2011-217826, filed on Sep. 30, 2011; the entire contents of each of which are incorporated herein by reference.

FIELD

Embodiments discussed herein generally relate to nonvolatile semiconductor memory devices.

BACKGROUND

As the size of NAND flash memory is decreased, an inter-cell interference effect during a multi-value write operation increases. As a result, a width of each threshold distributions of memory cells become wider at the time of multi-value writing. It leads to decrease the read margin.

BRIEF DESCRIPTION OF THE DRAWINGS

FIG. 5B is a diagram illustrating a setting method of the threshold distribution of the memory cell, FIGS. 5C through 5G are diagrams illustrating applying method of the write voltage and the write prohibit voltage;

FIGS. 7A and 7B are timing charts of methods of applying a write voltage and a write verify voltage in the nonvolatile semiconductor memory device according to a second embodiment, FIGS. 7C and 7D are diagrams illustrating applying method of the write voltage and the write prohibit voltage.

DETAILED DESCRIPTION

In a nonvolatile semiconductor memory device according to one embodiment, a write control unit performs a first write operation with respect to a first threshold distribution having a high level; a first verify operation for the first threshold distribution; and a second write operation on the basis of the result of the first verify operation. Then, the write control unit starts a write operation with respect to a second threshold distribution having a lower level than the first threshold distribution.

In the following, the nonvolatile semiconductor memory device according to embodiments will be described with reference to the drawings. It should be noted, however, that the present invention is not limited to any of the embodiments.

First Embodiment

Figure 1:
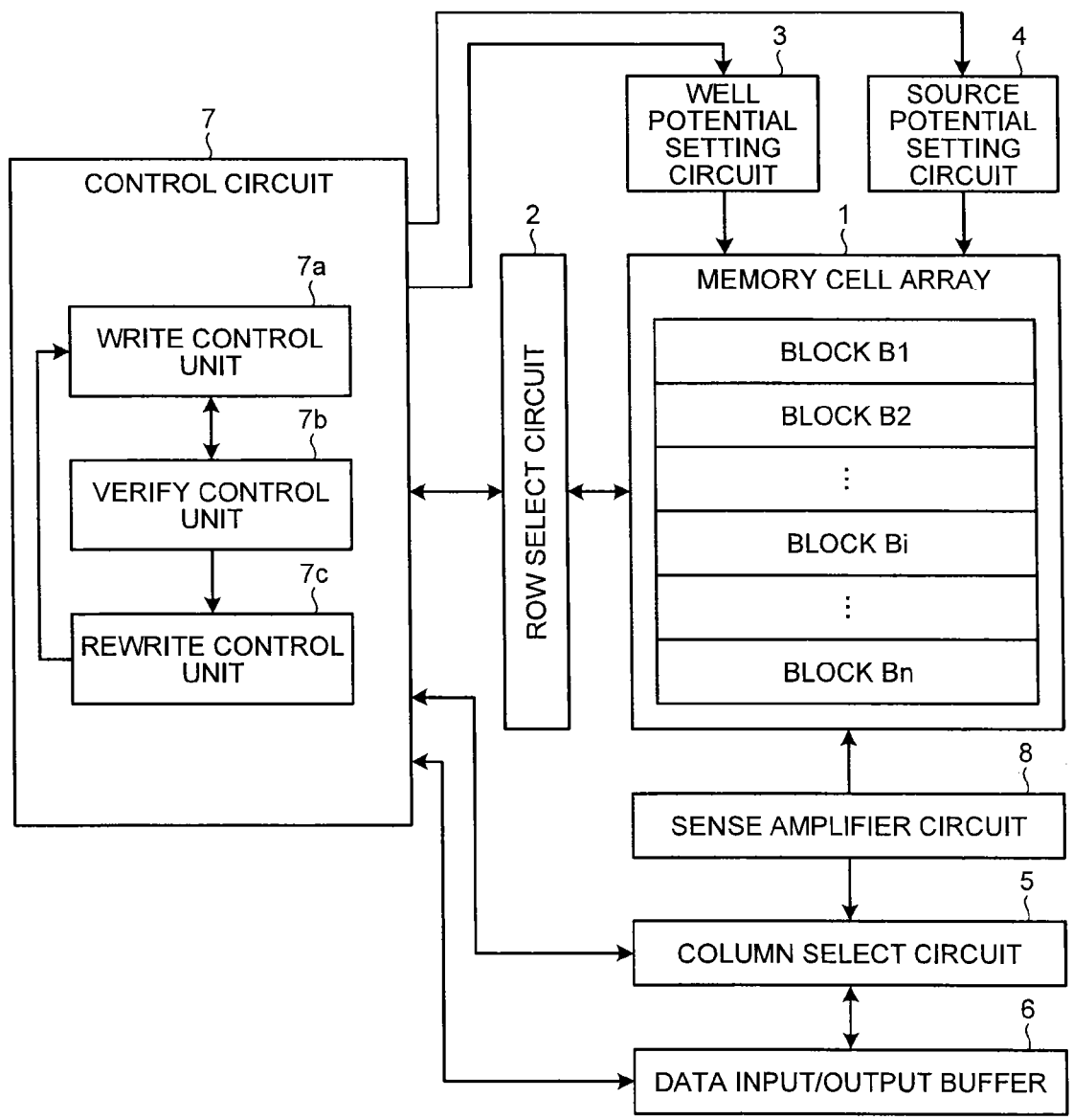
FIG. 1 is a block diagram schematically illustrating a structure of a nonvolatile semiconductor memory device according to a first embodiment.

FIG. 1 is a block diagram schematically illustrating the nonvolatile semiconductor memory device according to a first embodiment.

In FIG. 1, the nonvolatile semiconductor memory device includes a memory cell array 1, a row select circuit 2, a well potential setting circuit 3, a source potential setting circuit 4, a column select circuit 5, a data input/output buffer 6, a control circuit 7, and a sense amplifier circuit 8.

The memory cell array 1 includes memory cells for storing data arranged in a matrix in a row direction and a column direction. Each memory cell may be configured to store one bit of data, or it may be configured for multiple values so that two or more bits of data can be stored.

The memory cell array 1 includes a number n (n is a positive integer) of blocks B1 through Bn. The blocks B1 through Bn may include a plurality of NAND cell units arranged in the row direction.

Figure 2:
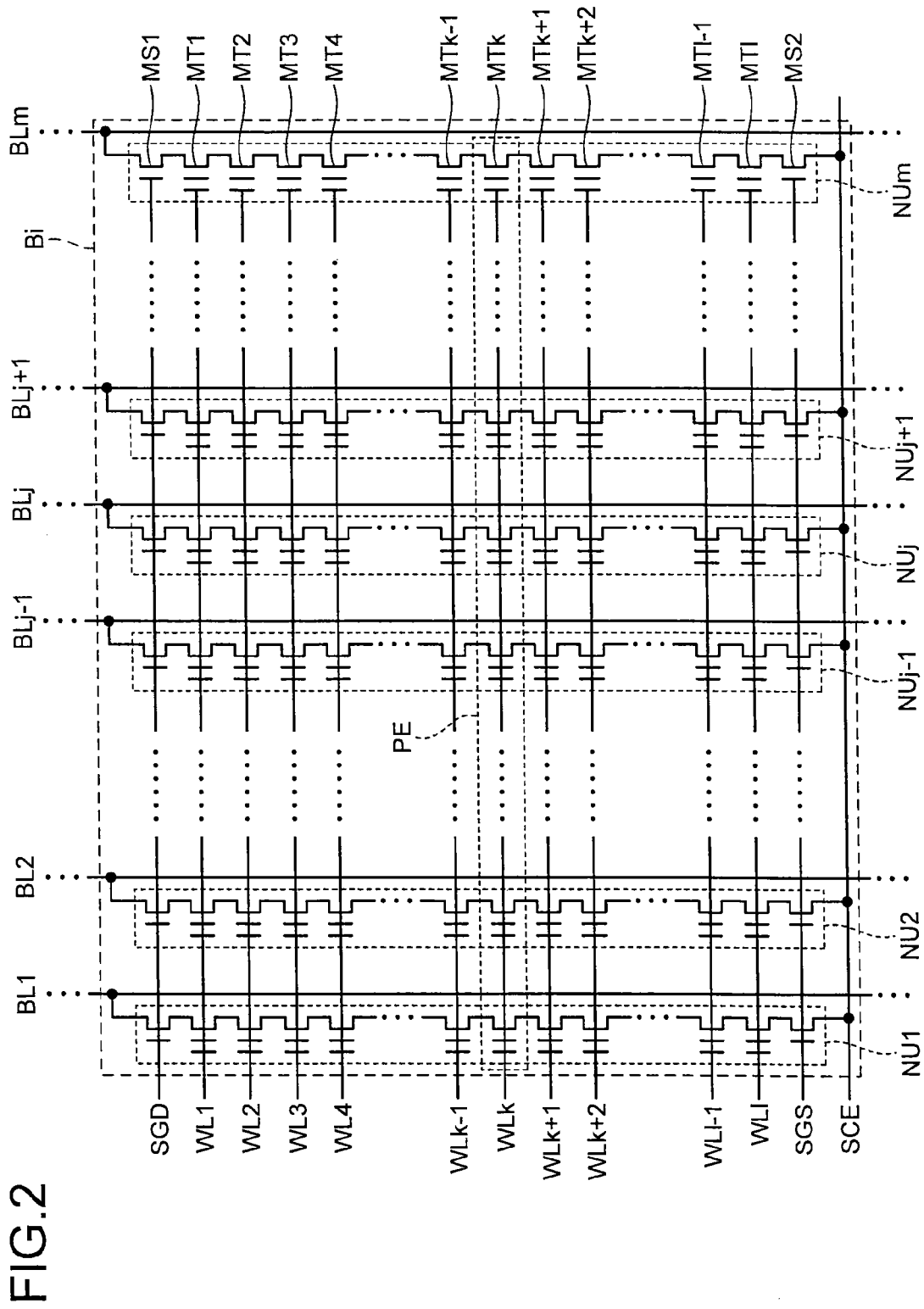
FIG. 2 is a circuit diagram schematically illustrating blocks in the nonvolatile semiconductor memory device of FIG. 1.

FIG. 2 is a circuit diagram schematically illustrating a block in the nonvolatile semiconductor memory device illustrated in FIG. 1.

In FIG. 2, the block Bi ($1 \leq i \leq n$, where i and n are positive integers) includes a number l (l is a positive integer) of word lines WL1 through WLl, select gate lines SGD and SGS, and a source line SCE. For the blocks B1 through Bn, a number m (m is a positive integer) of bit lines BL1 through BLm are commonly provided.

The block Bi includes m NAND cell units NU1 through NUm. The NAND cell units NU1 through NUm are connected to the bit lines BL1 through BLm, respectively.

Each of the NAND cell units NU1 through NUm includes cell transistors MT1 through MTl and select transistors MS1 and MS2. Each memory cell of the memory cell array 1 may include one cell transistor MTk ($1 \leq k \leq l$, where k is a positive integer). The cell transistors MT1 through MTl are connected in series to form a NAND string. At the ends of the NAND string, the select transistors MS1 and MS2 are connected, thus forming the NAND cell unit NUj ($1 \leq j \leq m$, where j is a positive integer).

In the NAND cell units NU1 through NUm, the word lines WL1 through WLl are connected to control gate electrodes of the cell transistors MT1 through MTl, respectively. In the NAND cell unit NUj, one end of the NAND string including the cell transistors MT1 through MTl is connected to the bit line BLj via the select transistor MS1. The other end of the NAND string is connected to the source line SCE via the select transistor MS2.

In the NAND cell units NU1 through NUm, a page PE may be formed by the m memory cells of the cell transistors MTk commonly connected to the word line WLk.

Figure 3:
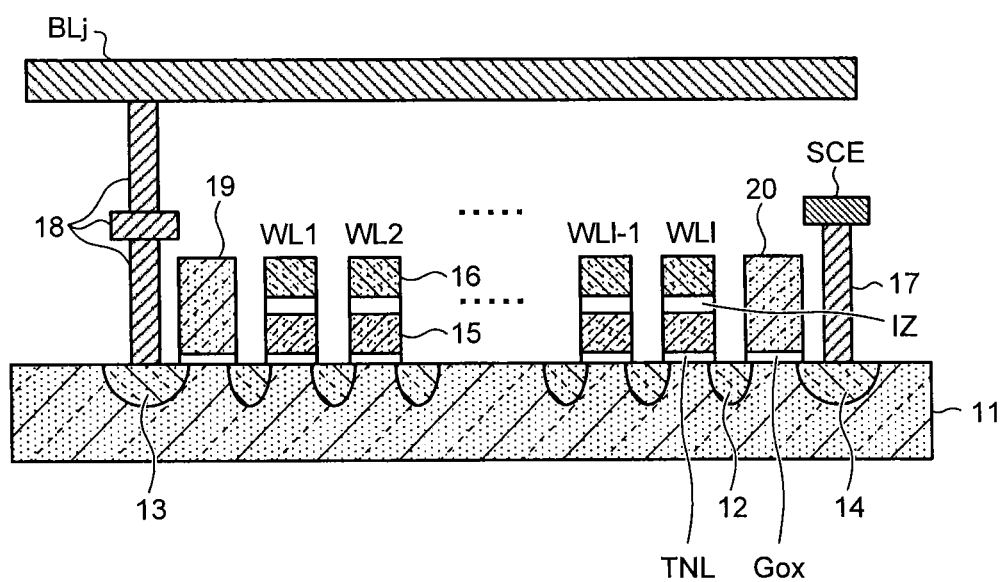
FIG. 3 is a cross section view of a cell unit of the nonvolatile semiconductor memory device of FIG. 1.

FIG. 3 is a cross section view of one cell unit of the nonvolatile semiconductor memory device of FIG. 1.

In FIG. 3, charge storage layers 15 are disposed on a well 11 via tunnel insulating films TNL and select gate electrodes 19 and 20 are disposed on the well 11 via gate insulating films Gox. On the charge storage layers 15, control gate electrodes 16 are disposed. The charge storage layers 15 and the control gate electrodes 16 may be insulated from each other via an insulating film IZ. Each of the charge storage layers 15 and the corresponding control gate electrode 16 thereon may constitute a single memory cell.

The well 11 includes impurity-diffused layers 12, 13, and 14 formed between the charge storage layers 15 or between the charge storage layers 15 and the select gate electrodes 19 and 20. For example, the well 11 is P-type and the impurity-diffused layers 12, 13, and 14 are N-type.

The impurity-diffused layer 13 is connected to the bit line BLj via a connection conductor 18. The impurity-diffused layer 14 is connected to the source line SCE via a connection conductor 17. The control gate electrodes 16 of the memory cells are connected to the corresponding word lines WL1 through WLl. The select gate electrodes 19 and 20 are connected to the select gate lines SGD and SGS, respectively.

In FIG. 1, the row select circuit 2 may select the memory cells of the memory cell array 1 in the row direction during a memory cell read, write, or erase operation. The well potential setting circuit 3 may set a well potential of the memory cell array 1 during a memory cell read, write, or erase operation. The source potential setting circuit 4 may set a source potential of the memory cell array 1 during a memory cell read, write, or erase operation. The column select circuit 5 may select the memory cells of the memory cell array 1 in the column direction during a memory cell read, write, or erase operation. The sense amplifier circuit 8 may determine data read from the memory cells on a column by column basis. The data input/output buffer 6 may send a command or an address received from the outside to the control circuit 7, or exchange data between the sense amplifier circuit 8 and the outside.

The control circuit 7 may control operations of the row select circuit 2, the well potential setting circuit 3, the source potential setting circuit 4, and the column select circuit 5 on the basis of a command and an address. The control circuit 7 includes a write control unit 7a, a verify control unit 7b, and a rewrite control unit 7c.

The write control unit 7a may control a memory cell write operation. The verify control unit 7b may search for a memory cell having a threshold voltage lower than a target verify level. The verify control unit 7b may also search for a memory cell having a threshold voltage higher than the target verify level. The rewrite control unit 7c may change a write voltage for a memory cell searched for by the verify control unit 7b that has a threshold value lower or higher than the target verify level.

In a write operation, a write voltage VW is applied to the selected word line WLk of the block Bi, and 0 V ("write voltage" as will be described later) or 2.5 V ("write prohibit voltage" as will be described later), for example, is applied to the selected bit line BLj of the block Bi, depending on the data written. For example, when data "0" is to be written, the selected bit line BLj is set at 0V, while when data "1" is to be written, the selected bit line BLj is set at the write prohibit voltage. To the non-selected word lines WL1 through WLk−1 and WLk+1 through WLl, a sufficiently high voltage for turning on the cell transistors MT1 through MTk−1 (such as 10 V) is applied. To the non-selected word lines WL1 through WLk−1 on the bit line BLj side with respect to the selected word line WLk, a sufficiently high voltage for turning the cell transistors MT1 through MTk−1 (such as 10 V) may be applied, while to the non-selected word lines WLk+1 through WLl on the source line SCE side with respect to the selected word line WLk, a sufficiently low voltage for turning off the cell transistors MTk+1 through MTl (such as 0 V) may be applied.

To the select gate line SGD, a voltage of 2.5 V, for example, is applied at which, depending on the bit line BL voltage, the select transistor MS1 is turned on when the threshold value of the cell transistor MT is to be increased or turned off when the threshold value of the cell transistor MT is not to be increased. To the select gate line SGS, a sufficiently low voltage for turning off the select transistor MS2 is applied.

When charges are to be injected into the charge storage layer 15, the 0 V of voltage applied to the bit line BLj is transferred to the NAND cell unit NUj because the select transistor MS1 is on. The voltage applied to the bit line BL when charges are to be injected into the charge storage layer 15 may be referred to as a "write voltage". The 0 V of voltage applied to the bit line BLj is transferred to the drain of the cell transistor MTk via the cell transistors MT1 through MTk−1 of the NAND cell unit NUj, while a high voltage is applied to the control gate electrode 16 of the selected cell, so that the potential of the charge storage layer 15 of the selected cell is increased. Thus, the charges are injected into the charge storage layer 15 from the drain of the selected cell by tunneling and thereby the threshold value of the cell transistor MTk is increased, whereby the write operation for the selected cell is performed.

On the other hand, when charges are not to be injected into the charge storage layer 15, the select transistor MS1 is turned off by the 2.5 V of voltage applied to the bit line BLj. The voltage applied to the bit line BL when charges are not to be injected into the charge storage layer 15 may be referred to as a "write prohibit voltage". As a result, the potential of the channel of the selected cell connected to the selected word line WLk is increased by the so-called self-boost. Thus, the charges are not injected into the charge storage layer 15 from the drain of the selected cell. Accordingly, the threshold voltage of the cell transistor MTk is not increased.

In a write verify operation, after the write operation is performed for the selected cell of the block Bi, it is determined whether the threshold value of the selected cell has reached a target threshold level. Specifically, a write verify voltage VY is applied to the selected word line WLk of the block Bi, while a sufficiently high voltage for turning on the cell transistors MT1 through MTk−1 and MTk+1 through MTl (such as 4.5 V) is applied to the non-selected word lines WL1 through WLk−1 and WLk+1 through WLl. To the select gate lines SGD and SGS, a sufficiently high voltage for turning on the select transistors MS1 and MS2 (such as 4.5 V) is applied. To the bit line BLj, a pre-charge voltage is applied while 0 V is applied to the source line SCE.

At this time, when the threshold value of the selected cell is not at the target threshold level, the bit line BLj is discharged via the NAND cell unit NUj, whereby the potential of the bit line BLj is decreased to a low level. On the other hand, when the threshold value of the selected cell is at the target threshold level, the bit line BLj is not discharged via the NAND cell unit NUj, so that the potential of the bit line BLj reaches a high level.

Then, by determining whether the potential of the bit line BLj is at the low level or the high level, it is determined whether the threshold value of the selected cell is at a search threshold level. When the threshold value of the selected cell is at the target threshold level, the write process for the selected cell ends. When the threshold value of the selected cell is not at the search threshold level, a rewrite operation for the selected cell is performed.

In a rewrite operation, the rewrite control unit 7c sets a rewrite voltage VRW on the selected word line WLk of the block Bi. The rewrite voltage VRW may be higher than the write voltage VW at the start of the write operation for the selected cell.

Then, the write control unit 7a applies the rewrite voltage VRW to the selected word line WLk of the memory cell that is not at the search threshold level. Further, 0 V is applied to the bit line of the memory cell that is not at the search threshold level. At this time, the write control unit 7a applies the write prohibit voltage to the bit line of a memory cell of which the threshold value after writing is at the search threshold level, or causes the bit line to be floating, in order to prevent rewriting of the memory cell of which the threshold value after writing is at the search threshold level. To the non-selected word lines WL1 through WLk−1 and WLk+1 through WLl, a sufficiently high voltage for turning on the cell transistors MT1 through MTk−1 (such as 10V) is applied. To the non-selected word lines WL1 through WLk−1 on the bit line BLj side with respect to the selected word line WLk, a sufficiently high voltage for turning on the cell transistors MT1 through MTk−1 (such as 10 V) may be applied while to the non-selected word lines WLk+1 through WLl on the source line SCE side with respect to the selected word line WLk, a sufficiently low voltage for turning off the cell transistors MTk+1 through MTl (such as 0 V) may be applied.

Further, the write control unit 7a applies a voltage to the select gate line SGD such that the select transistor MS1 is turned on when the write voltage is applied to the bit line BL and turned off when the write prohibit voltage is applied to the bit line BL. The write control unit 7a also applies a sufficiently low voltage for turning off the select transistor MS2 to the select gate line SGS.

Then, the 0 V of voltage applied to the bit line of the memory cell of which the threshold value after writing is not at the search threshold level is transferred to the drain of the cell transistor MTk of the memory cell via the cell transistors MT1 through MTk−1 of the NAND cell unit NUj, while a high voltage is applied to the control gate electrode 16 of the memory cell. Thus, the potential of the charge storage layer 15 of the memory cell of which the threshold value after writing is not at the search threshold level is increased. As a result, charges are injected, by tunneling, into the charge storage layer 15 from the drain of the memory cell of which the threshold value after writing is not at the search threshold level, resulting in an increase in the threshold value of the cell transistor MTk of the memory cell. In this way, a rewrite operation is performed for the memory cell of which the threshold value after writing is not at the search threshold level.

The rewrite operation is performed for only the memory cell of which the threshold value after writing is not at the search threshold level, in what may be hereafter referred to as a "lockout operation". The lockout operation enables a low-level area of a threshold distribution after writing to be shifted toward a high-level area without shifting the high-level area of the threshold distribution after writing. Thus, the threshold distribution after writing can be narrowed without increasing the number of times of the write verify operation. Accordingly, the read margin can be increased without adversely affecting performance.

FIGS. 4A through 4E illustrate transition states of threshold distributions at the time of writing in the nonvolatile semiconductor memory device of FIG. 1. In FIGS. 4A through 4E, the memory cells are configured for four values (two bits of data are stored in each memory cell) by way of example. When four values are stored, the threshold distribution E has the lowest level, the threshold distribution A has the third highest level, the threshold distribution B has the second highest level, and the threshold distribution C has the highest level. The threshold distributions E and A through C may correspond to two bits of data "11", "10", "00", and "01", respectively. The threshold distribution A has a target verify level VfA, the threshold distribution B has a target verify level VfB, and the threshold distribution C has a target verify level VfC, where 0<VfA<VfB<VfC. The verify levels Vf are substantially equal to the value at the low-level end of the respective threshold distributions.

Figure 4A:
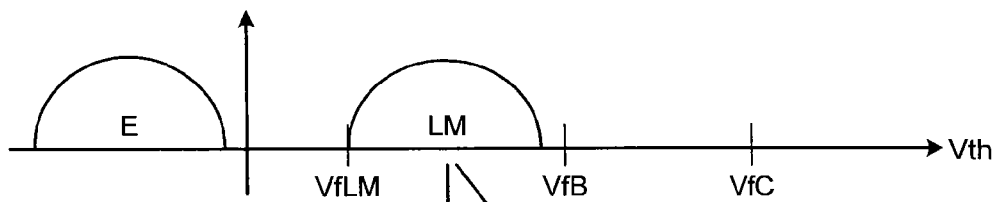
FIGS. 4A through 4E illustrate transition states of threshold distributions at the time of writing in the nonvolatile semiconductor memory device of FIG. 1.

Referring to FIG. 4A, in an erase operation, the threshold distribution E of all of the memory cells in each block may be set to be negative. In a memory cell write, a lower page write is performed, whereby a threshold distribution LM is generated for a memory cell to be written. This operation may be referred to as a "low write". The target verify level of the threshold distribution LM may be set at VfLM so that the threshold distribution LM can be positive. Preferably, the verify level VfLM may be lower than the verify level VfB. The verify level VfLM may be equal to or different from the verify level VfA.

In a write operation, the write voltage VW is applied once, and a verify Vf of the threshold distributions A through C is performed. Thereafter, a rewrite operation is performed for the memory cells of which the threshold value after writing is not at the search threshold level. This operation may be hereafter referred to as a "normal write operation".

Figure 4B:
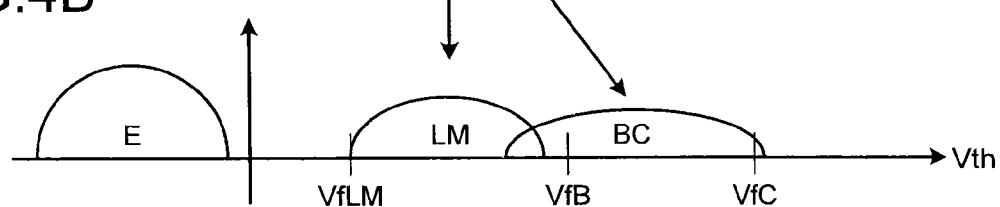

In the four-value write operation of the present example, the write control unit 7a may perform an initial write operation corresponding to the threshold distribution C prior to performing the normal write operation. This operation may be hereafter referred to as a "C pulse write operation". In the C pulse write operation, as illustrated in FIG. 4B, the threshold distribution BC is generated by shifting the cells in which the threshold value of a C level is to be written from the threshold distribution LM toward the high level. The threshold distribution BC is generated on the high-level side of the threshold distribution LM. The threshold distribution BC has a wide distribution width such that its high-level end covers the target verify level VfC and its low-level end covers the target verify level VfB. Depending on the initial write operation conditions, the low-level end of the threshold distribution BC may be higher than the target verify level VfB. Preferably, at this time, the write voltage for the initial write operation may be higher than the write voltage at the start of the write operation for the threshold distributions A through C.

Figure 4C:
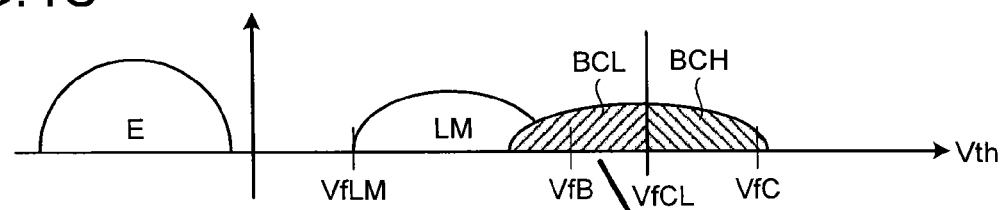

After the threshold distribution BC is generated, a write verify operation is performed with respect to only the threshold distribution BC on the basis of the write verify level VfCL, as illustrated in FIG. 4C. This operation may be referred to as a "search verify operation". The write verify level VfCL is set to be lower than the target verify level VfC.

In the search verify operation, the verify control unit 7b checks whether the memory cells for which the write operation corresponding to the threshold distribution BC has been performed are at the write verify level VfCL, thereby searching for a low-level area BCL and a high-level area BCH of the threshold distribution BC.

Figure 4D:
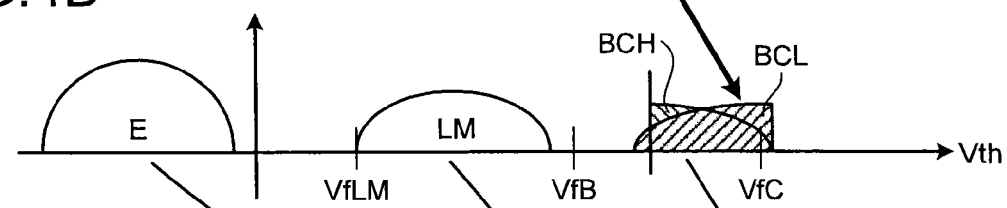

Then, as illustrated in FIG. 4D, a rewrite operation is performed only for the memory cells belonging to the low-level area BCL of the threshold distribution BC, whereby the low-level area BCL of the threshold distribution BC is shifted toward the high-level side. This write operation may be referred to as an "additional C-pulse write operation". Preferably, the rewrite voltage for the rewrite operation for the low-level area BCL may be higher than the write voltage for the write operation for the threshold distribution BC. By the search verify operation and the additional C-pulse write operation, only the low-level end of the threshold distribution BC can be shifted toward the high-level side. As a result, the width of the threshold distribution BC can be made narrower. Namely, because the threshold distribution C is generated by shifting the threshold distribution BC toward the high-level side, narrowing of the width of the threshold distribution BC leads to the narrowing of the width of the threshold distribution C.

After the additional C-pulse write operation, the search verify operation is not performed. As a result, the speed of the write operation can be increased. The width of the threshold distribution BC can be made narrower by locating the low-level end of the threshold distribution BC at or above the verify level VfCL via the search verify operation. However, the low-level end of the threshold distribution C is adjusted in a subsequent write verify operation by using the verify level VfC. After the additional C-pulse write operation, the need for the search verify operation is small. Thus, the speed of the write operation can be increased by not performing the search verify operation after the additional C-pulse write operation.

Figure 4E:
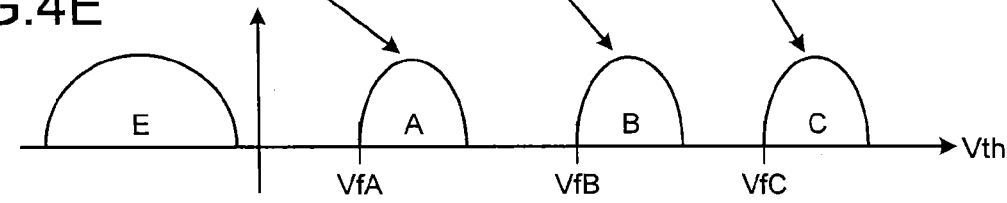

Then, as illustrated in FIG. 4E, the threshold distribution A is generated from the threshold distribution E, the threshold distribution B is generated from the threshold distribution LM, and the threshold distribution C is generated from the high-level area BCH and the low-level area BCL of the threshold distribution BC, the low-level area BCL having been shifted toward the high-level side, through the normal write operation and the write verify operation.

By generating the threshold distribution BC before the threshold distributions A and B are generated and then generating the threshold distribution C from the threshold distribution BC, the inter-cell interference to which the threshold distributions A and B are subjected can be decreased and the spreading of the threshold distributions A and B can be suppressed more than by a method by which the threshold distribution C is generated from the threshold distribution LM after the threshold distributions A and B are generated. Inter-cell interference in the example of FIG. 3 causes the charge storage layer 15 of a own cell to be discharged by capacitive coupling when a high voltage is applied to the control gate electrodes 16 of an adjacent cell, thereby varying the threshold value of the own cell.

Further, by performing the additional C-pulse write operation only for the memory cells belonging to the low-level area BCL of the threshold distribution BC, the low-level area BCL of the threshold distribution BC can be shifted toward the high-level area side without shifting the high-level area BCH of the threshold distribution BC. As a result, the threshold distribution C can be made narrower.

The threshold distribution C is generated from the threshold distribution BC. Thus, by raising the low-level end of the threshold distribution BC, the number of times of application of the write voltage VW for generating the threshold distribution C can be decreased. As a result, the inter-cell interference from the threshold distribution C to the threshold distributions A and B can be decreased. Namely, variations in the threshold values of the threshold distributions A and B can be decreased. Particularly, the decrease in the number of times of writing for the threshold distribution C (number of times of application of the write voltage VW), which uses a high write voltage, has a large effect of decreasing inter-cell interference.

A low write is not an essential condition of the present embodiment. Preferably, the threshold distributions A through C may be generated by performing the C pulse write operation, the search verify operation, and the additional C-pulse write operation without performing the low write. In this case, the threshold distribution BC may be generated from the threshold distribution E by the C pulse write operation. Thus, the above effects can be obtained without performing the low write. As a result, the writing speed can be further increased.

Figure 5A:
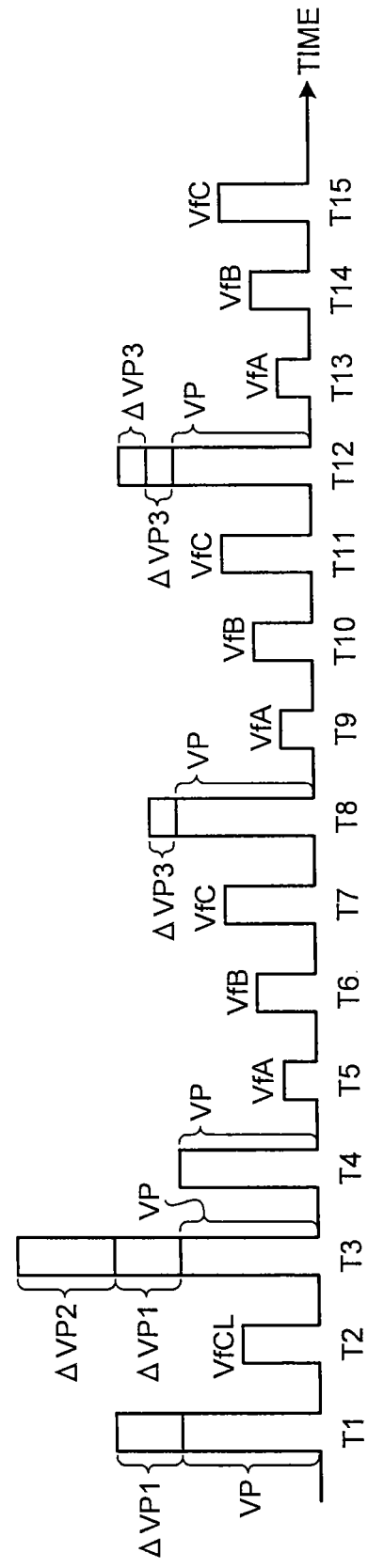
FIG. 5A is a timing chart illustrating a method of applying a write voltage and a write verify voltage in the nonvolatile semiconductor memory device of FIG. 1.
Figures 5B, 5C:
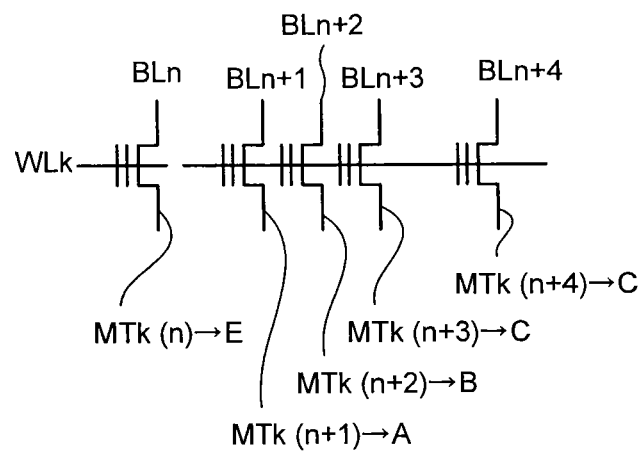

FIG. 5A is a timing chart for a method of applying the write voltage and the write verify voltage in the nonvolatile semiconductor memory device illustrated in FIG. 1, FIG. 5B is a diagram illustrating a setting method of the threshold distribution of the memory cell, FIGS. 5C through 5G are diagrams illustrating applying method of the write voltage and the write prohibit voltage.

Referring to FIG. 5A, when the threshold distribution LM of FIG. 4A is generated, the write voltage VW is applied to the selected cell so as to perform a write operation for the selected cell, thereby generating the threshold distribution BC (T1; C pulse write operation). Preferably, at this time, the write voltage VW includes a program voltage VP to which an offset voltage ΔVP1 is added. The offset voltage ΔVP1 may be set higher than a step-up voltage ΔVP3. For example, as shown in FIG. 5B, a case is considered in which the threshold value of the memory cell MTk(n) is to be in the threshold distribution E, the threshold value of the memory cell MTk(n+1) is to be in the threshold distribution A, the threshold value of the memory cell MTk(n+2) is to be in the threshold distribution B, and the threshold values of the memory cells MTk(n+3) and MTk(n+4) are to be in the threshold distribution C, where n is an integer of 1 or more and (m−4) or less.

As shown in FIG. 5C, at T1, the write voltage VP+ΔVP1 is applied to the selected word line WLk, the write voltage is applied to the selected bit lines BLn+3 and BLn+4, and the write prohibit voltage is applied to the non-selected bit line BLn through the bit line BLn+2.

It is also possible to perform the C pulse write operation a plurality of times (see FIG. 5D, p is an integer of 2 or more). As a result, by raising the low-level end of the threshold distribution BC, the number of applying the write voltage for generating the threshold distribution C from the threshold distribution BC can be decreased. Moreover, the C pulse write operation can be stepped up by the step-up voltage ΔVP3 and the write verify for the threshold distribution C can be performed after the C pulse write operation. Consequently, the width of the threshold distribution BC can be narrowed, so that the width of the threshold distribution C can be narrowed.

Then, the verify voltage VF is applied to the selected cell so as to perform the verify operation with respect to the threshold distribution BC and search for the low-level area BC of the threshold distribution BC (T2; search verify operation). At this time, the verify voltage VF may be set at the verify level VfCL.

Next, the rewrite voltage VRW is applied only to the memory cells in the low-level area BC of the threshold distribution BC, and the rewrite operation is performed for the memory cells, thereby shifting the low-level area BC of the threshold distribution BC toward the high-level side (T3; additional C-pulse write operation). Preferably, at this time, the rewrite voltage VRW includes the program voltage VP to which offset voltages ΔVP1 and ΔVP2 are added. This is so that the memory cells having small amounts of shift in the threshold value at the time of the C pulse write operation can be shifted. The offset voltage ΔVP2 may be set to a value higher than the step-up voltage ΔVP3. The additional C pulse write operation may be performed a plurality of times. As a result, by raising the low-level end of the threshold distribution BC, the number of times of applying the write voltage for generating the threshold distribution C from the threshold distribution BC can be decreased.

For example, a case is considered in which the threshold voltage of the memory cell MTk(n+3) belongs to the high-level area BCH of the threshold distribution BC and the threshold voltage of the memory cell MTk(n+4) belongs to the low-level area BCL of the threshold distribution BC. As shown in FIG. 5E, at T3, the write voltage VP+ΔVP1+ΔVP2 is applied to the selected word line WLk, the write voltage is applied to the selected bit line BLn+4, and the write prohibit voltage is applied to the non-selected bit line BLn through the bit line BLn+3.

Then, the normal write operation is performed without performing the search verify operation. Specifically, the write voltage VW is applied to the selected cells and then the write operation for the selected cells is performed, thereby adjusting the threshold value of the selected cells to be within the threshold distributions A through C (T4). At this time, the write voltage VW may be set at the program voltage VP.

As shown in FIG. 5F, at T4, the write voltage VP is applied to the selected word line WLk, the write voltage is applied to the selected bit lines BLn+1 through BLn+4, and the write prohibit voltage is applied to the non-selected bit line BLn.

Then, the write verify voltage VY is applied to the selected cells successively, thereby performing the write verify for the threshold distributions A through C successively (T5 through T7). At this time, the write verify voltage VY may be set at the target verify level VfA for the threshold distribution A, at the target verify level VfB for the threshold distribution B, or at the target verify level VfC for the threshold distribution C.

When the threshold values of the selected cells are not at the target verify levels VfA through VfC, the write operation for the selected cells is repeated until the threshold values of the selected cells reach the target verify levels VfA through VfC while the write voltage VW is increased by adding the step-up voltage ΔVP3 (T8 through T15). The write operation is stopped by the lockout operation for one memory cell after another as they reach the target verify level Vf.

For example, a case is considered in which in the write verify at the time T5 through T7, the threshold voltage of the memory cell MTk(n+1) reaches the target verify level VfA and the threshold voltages of the memory cells MTk(n+2) through MTk(n+4) have not reached the target verify level. For example, as shown in FIG. 5G, at T8, the write voltage VP+ΔVP3 is applied to the selected word line WLk, the write voltage is applied to the selected bit lines BLn+2 through n+4, and the write prohibit voltage is applied to the non-selected bit lines BLn and BLn+1.

Figure 6:
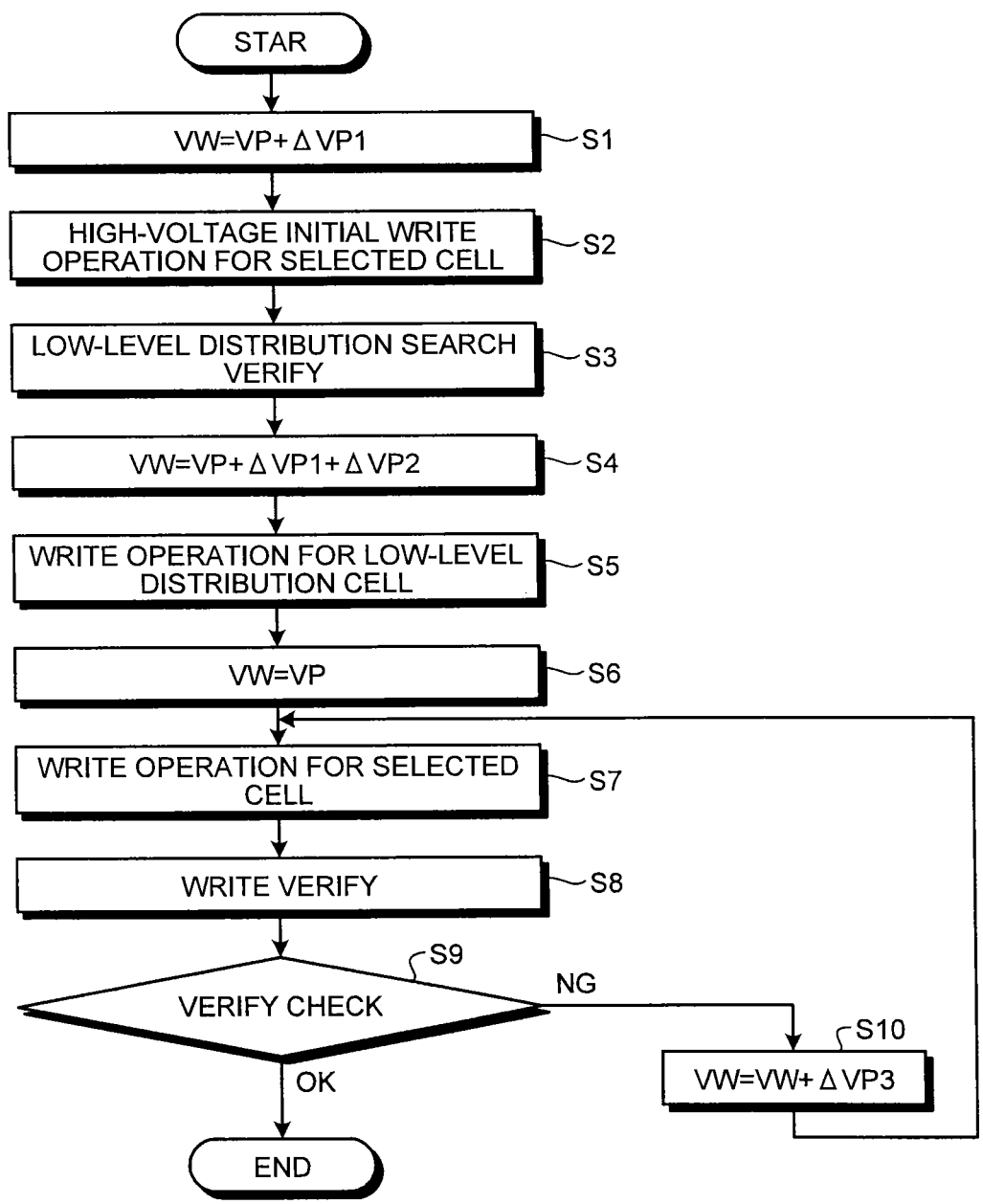
FIG. 6 is a flowchart of a write operation in the nonvolatile semiconductor memory device of FIG. 1.

FIG. 6 is a flowchart of a write operation in the nonvolatile semiconductor memory device illustrated in FIG. 1.

In FIG. 6, the write control unit 7a sets the write voltage VW at VP+ΔVP1 (S1) and then performs the write operation for the selected cell that is written into the threshold distribution C (S2, T1 in FIG. 5; C pulse write operation).

Then, the verify control unit 7b verifies the selected cell, thereby searching for the low-level area of the threshold distribution of the selected cell (S3, T2 in FIG. 5; search verify operation).

Next, the write control unit 7a sets the write voltage VW at VP+ΔVP1+ΔVP2 (S4), and then performs the rewrite operation only for the low-level area of the selected cell (S5, T3 in FIG. 5; additional C-pulse write operation).

Then, the write control unit 7a sets the write voltage VW at VP (S6) and performs a write operation for the selected cells to be written into the threshold distributions A through C (S7, T4 in FIG. 5). The verify control unit 7b then performs a write verify operation on the selected cells (S8, T5 through T7 in FIG. 5). When the selected cells fail the verify check operation (S9), the write control unit 7a repeats the write operation for the selected cells while the step-up voltage ΔVP3 is added to the write voltage VW by the rewrite control unit 7c until the selected cells pass the verify check (T9 and S10).

Second Embodiment

FIGS. 7A and 7B are timing charts of methods of applying the write voltage and the write verify voltage in the nonvolatile semiconductor memory device according to the second embodiment, FIGS. 7C and 7D are diagrams illustrating applying method of the write voltage and the write prohibit voltage. The second embodiment differs from the first embodiment in that the C pulse write operation and the search verify operation are incorporated into the normal write operation. Description of structures or operations similar to those of the first embodiment will be omitted.

In FIG. 7A, when the threshold distribution LM of FIG. 4A is generated, the write control unit 7a applies the write voltage VW to the selected cell to be written into the threshold distribution C, and performs the write operation for the selected cell. As a result, the threshold distribution BC is generated (T21). Preferably, at this time, the write voltage VW may include the program voltage VP to which the offset voltage ΔVP1 is added. The low write operation may be omitted as in the first embodiment. In the similar manner to the first embodiment, it is also possible to perform the C pulse write operation a plurality of times (see FIG. 7B, p is an integer of 2 or more). Moreover, the C pulse write operation can be stepped up by the step-up voltage ΔVP3 and the write verify for the threshold distribution C can be performed after the C pulse write operation. Consequently, the width of the threshold distribution BC can be narrowed, so that the width of the threshold distribution C can be narrowed.

Then, the normal write operation and a write operation which is a variation of the write verify operation are performed. This normal write operation may be hereafter referred to as a "first normal write operation". The write control unit 7a applies the write voltage VW to the selected cells and performs a write operation for the selected cells to be written into the threshold distributions A and B, thereby adjusting the threshold values of the selected cells such that the threshold distributions A and B can be within the target verify levels VfA and VfB, respectively (T22). At this time, the write voltage VW may be set at the program voltage VP. For example, in the similar manner to the first embodiment, a case shown in FIG. 5B is considered. As shown in FIG. 7C, at T22, the write voltage VP is applied to the selected word line WLk, the write voltage is applied to the selected bit lines BLn+1 and BLn+2, and the write prohibit voltage is applied to the non-selected bit lines BLn, BLn+3, and BLn+4.

In the first normal write operation, the selected cell to be written into the threshold distribution C may also be written. In this case, as shown in FIG. 7D, at T22, the write voltage VP is applied to the selected word line WLk, the write voltage is applied to the selected bit lines BLn+1 through BLn+4, and the write prohibit voltage is applied to the non-selected bit line BLn.

Next, the write verify voltage VY is applied to the selected cells successively so as to perform the write verify operation with respect to the threshold distributions A and B successively (T23 and T24). At this time, the verify control unit 7b may set the write verify voltage VY for the threshold distribution A and the threshold distribution B at the target verify level VfA and the target verify level VfB, respectively. Together with the verify operation, an operation similar to the search verify operation is also performed. For the memory cell to be written into the threshold distribution BC (threshold distribution C), the verify control unit 7b sets the write verify voltage VY at the target verify level VfCL. The operations at T23 through T25 may be referred to as a "first verify operation".

Then, the write control unit 7a applies the rewrite voltage VRW only to the memory cells in the low-level area BC of the threshold distribution BC and performs a rewrite operation for the memory cells, thereby shifting the low-level area BC of the threshold distribution BC toward the high-level side (T26; additional C-pulse write operation). Preferably, at this time, the rewrite voltage VRW may include the program voltage VP to which the offset voltages ΔVP1 and ΔVP2 and the step-up voltage ΔVP3 are added.

Then, the normal write operation is performed without performing the search verify operation. Hereafter, this operation will be referred to as a "second normal write operation". The write control unit 7a applies the write voltage VW to the selected cells and performs a write operation for the selected cells, so that the threshold values of the selected cells can be adjusted to be within the threshold distributions A through C (T27). At this time, the rewrite control unit 7c may add the step-up voltage ΔVP3 to the program voltage VP to obtain the write voltage VW.

Then, the verify control unit 7b applies the write verify voltage VY to the selected cells successively, thereby performing a write verify operation with regard to the threshold distributions A through C successively (T28 through T30). At this time, the write verify voltage VY for the threshold distribution C may be set at the target verify level VfC. Hereafter, the operations at T28 through T30 may be referred to as a "second verify operation".

When the threshold values of the selected cells are not at the target verify levels VfA through VfC, the write control unit 7a repeats the write operation for the selected cells while the step-up voltage ΔVP3 is added to the voltage VW by the rewrite control unit 7c until the threshold values of the selected cells reach the target verify levels VfA through VfC (T31 through T38).

In this way, the second embodiment can provide the same effects as according to the first embodiment. Further, by incorporating the C pulse write operation and the search verify operation into the normal write operation, efficiency of the write process can be increased.

While several embodiments of the present invention have been described, these embodiments are illustrative and are not intended to limit the scope of the present invention. These novel embodiments may be implemented in many other various ways, and various omissions, substitutions, or modifications may be made without departing from the scope of the present invention. These embodiments and their variations are included in the scope of the invention and equivalents thereof. While in the foregoing embodiments the memory cells are configured for four values, the present invention is also applicable for eight- or sixteen-value memory cells. In such cases, the C pulse write operation, the search verify operation, and the additional C-pulse write operation may be performed for the highest threshold distribution. It is also possible to apply the C pulse write operation, the search verify operation, and the additional C-pulse write operation to a distribution having a large amount of shift in threshold distribution, such as when the threshold distribution E is shifted to the threshold distribution A. The amount of shift from the threshold distribution E to the threshold distribution A is larger than the amount of shift from the threshold distribution LM to the threshold distribution B. When the threshold distribution has a large amount of shift, a large write voltage is required, resulting in an increase in inter-cell interference. As a result, the width of the threshold distribution is increased. Thus, the above-described effects can be also obtained when the present invention is applied on the basis of the amount of shift in threshold distribution instead of the level of threshold distribution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array including a plurality of memory cells arranged in a matrix; and
    a control circuit configured to control a write operation for the memory cells and configured to control a write verify operation on the basis of a target verify level of a threshold level,
    wherein the control circuit performs a first write operation with respect to a first threshold level and a second threshold level, a first verify operation with respect to the first threshold level, and a second write operation for shifting the second threshold level to a fourth threshold level on the basis of a result of the first verify operation, and starts a third write operation with respect to the first threshold level and the fourth threshold level.

2. The nonvolatile semiconductor memory device according to claim 1, wherein the control circuit performs the third write operation without performing a second verify operation with respect to the fourth threshold level after the second write operation.

3. The nonvolatile semiconductor memory device according to claim 2, wherein the control circuit also writes in the memory cells to be written into the second threshold level in the third write operation.

4. The nonvolatile semiconductor memory device according to claim 1, wherein the control circuit performs the first write operation only with respect to the memory cells to be written into the first threshold level and a second threshold level.

5. The nonvolatile semiconductor memory device according to claim 1, wherein the second threshold level has a lower level than the first threshold level.

6. The nonvolatile semiconductor memory device according to claim 1, wherein the first write operation is performed a plurality of times.

7. The nonvolatile semiconductor memory device according to claim 1, wherein the memory cells are configured for multiple values and perform the write operation after performing a low write.

8. A nonvolatile semiconductor memory device comprising:
    a memory cell array including a plurality of memory cells arranged in a matrix; and
    a write control unit configured to control a write operation for the memory cells and configured to control a write verify operation on the basis of a target verify level of a threshold level,
    wherein the write control unit performs a first write operation with respect to a first threshold level, a first verify operation with respect to the first threshold level, and a second write operation on the basis of a result of the first verify operation, and starts a third write operation with respect to a second threshold level, wherein the memory cell array includes:
- a NAND string including the memory cells connected in series;
- a first select transistor connected to one end of the NAND string; and
- a second select transistor connected to another end of the NAND string.

9. The nonvolatile semiconductor memory device according to claim 8, wherein the memory cell further includes:
- a charge storage layer formed on a well via a tunnel insulating film; and
- a control gate electrode formed on the charge storage layer via an insulating film.

10. A nonvolatile semiconductor memory device comprising:
- a memory cell array including a plurality of memory cells arranged in a matrix; and
- a write control unit configured to control a write operation for the memory cells and configured to control a write verify operation on the basis of a target verify level of a threshold level, wherein the write control unit performs:
- a first write operation with respect to a first threshold level;
- a second write operation with respect to at least one second threshold level except for the first threshold level;
- a first verify operation for the first threshold level and the second threshold level;
- a third write operation with respect to the first threshold level on the basis of a result of the first verify operation; and
- a fourth write operation with respect to the second threshold level on the basis of the result of the first verify operation.

11. The nonvolatile semiconductor memory device according to claim 10, wherein the first threshold level has a higher level than the second threshold level.

12. The nonvolatile semiconductor memory device according to claim 11, wherein the first write operation is performed a plurality of times.

13. The nonvolatile semiconductor memory device according to claim 10, wherein the write control unit also performs a write operation for the first threshold level in the second write operation.

14. The nonvolatile semiconductor memory device according to claim 10, wherein the memory cell array includes:
- a NAND string including the memory cells connected in series;
- a first select transistor connected to one end of the NAND string; and
- a second select transistor connected to another end of the NAND string.

15. The nonvolatile semiconductor memory device according to claim 14, wherein the memory cell further includes:
- a charge storage layer formed on a well via a tunnel insulating film; and
- a control gate electrode formed on the charge storage layer via an insulating film.

16. The nonvolatile semiconductor memory device according to claim 10, wherein the memory cells are configured for multiple values and perform the write operation after performing a low write.

17. A nonvolatile semiconductor memory device comprising:
- a memory cell array including a plurality of memory cells arranged in a matrix; and
- a control circuit configured to control a write operation for the memory cells and configured to control a write verify operation on the basis of a target verify level of a threshold level, wherein the control circuit performs a search verify operation with respect to a first threshold level and a second threshold level on the basis of a write verify level smaller than the target verify level, and shifts the second threshold level toward the first threshold level by performing a rewrite operation only in one or more of the memory cells belonging to the second threshold level.

18. The nonvolatile semiconductor memory device according to claim 17, wherein the second threshold level has a lower level than the first threshold level.

* * * * *